(12) United States Patent
Browne et al.

(10) Patent No.: US 8,798,844 B2
(45) Date of Patent: Aug. 5, 2014

(54) DIAGNOSTIC METHOD AND APPARATUS FOR ELECTRIC POWER STEERING SYSTEM

(75) Inventors: Philip Owen Browne, Bromsgrove (GB); Adrian Szabo, Solihull (GB)

(73) Assignee: TRW Limited, West Midlands (GB)

(*) Notice: Subject to any disclaimer, the term of this patent is extended or adjusted under 35 U.S.C. 154(b) by 413 days.

(21) Appl. No.: 13/196,995

(22) Filed: Aug. 3, 2011

(65) Prior Publication Data
US 2012/0035801 A1 Feb. 9, 2012

(30) Foreign Application Priority Data
Aug. 4, 2010 (GB) .................................. 1013106.8

(51) Int. Cl.
*G01M 17/00* (2006.01)
*G06F 7/00* (2006.01)
*G06F 19/00* (2011.01)
*G01R 31/327* (2006.01)
*B62D 5/04* (2006.01)

(52) U.S. Cl.
CPC .......... *B62D 5/0487* (2013.01); *G01R 31/3278* (2013.01)
USPC ............ 701/29.1; 701/9; 701/29.2; 701/30.5; 701/30.9; 701/31.1; 701/33.7; 701/33.9

(58) Field of Classification Search
USPC ................. 701/9, 29.1, 29.2, 30.5, 30.9, 31.1, 701/33.7, 33.9; 180/6.28, 6.44, 213, 253
See application file for complete search history.

(56) References Cited

U.S. PATENT DOCUMENTS

| | | | |
|---|---|---|---|
| 6,392,854 B1 | 5/2002 | O'Gorman | |
| 6,448,724 B1* | 9/2002 | Kleinau et al. | 318/400.25 |
| 7,433,767 B2* | 10/2008 | Takeuchi et al. | 701/41 |
| 7,880,417 B2* | 2/2011 | Suzuki | 318/432 |
| 7,908,057 B2* | 3/2011 | Sawada et al. | 701/43 |
| 2009/0066286 A1 | 3/2009 | Gunji | |
| 2010/0017063 A1* | 1/2010 | Maeda | 701/42 |
| 2012/0013282 A1* | 1/2012 | Introwicz | 318/400.06 |
| 2012/0145472 A1* | 6/2012 | Imamura et al. | 180/446 |

FOREIGN PATENT DOCUMENTS

EP 2052948 A2 4/2009

* cited by examiner

*Primary Examiner* — Khoi Tran
*Assistant Examiner* — Jorge Peche
(74) *Attorney, Agent, or Firm* — MacMillan, Sobanski & Todd, LLC

(57) ABSTRACT

A method and apparatus diagnoses a correct operation of a phase or star point isolation relay in an electric power steering system of the kind including a motor drive circuit and at least one phase isolation relay which connects a part of the drive circuit to a phase of the motor. The relay is opened during shutdown to isolate the motor phase from the part of the drive circuit and is normally closed during operation of the motor to connect the phase to the part of the drive circuit. The method includes the steps of: closing the relay; demanding a current through the motor phase associated with the relay that is equal to a predetermined value; measuring at least one characteristic of the phase current in that phase after a predetermined period of time has elapsed, the elapsed time being less than a time needed for the phase current to reach the demanded current value; comparing the measured characteristic of the phase current with a reference characteristic of the phase current; and, in the event that the measured characteristic does not correspond with the reference characteristic, opening the relay and subsequently repeating the steps.

10 Claims, 5 Drawing Sheets

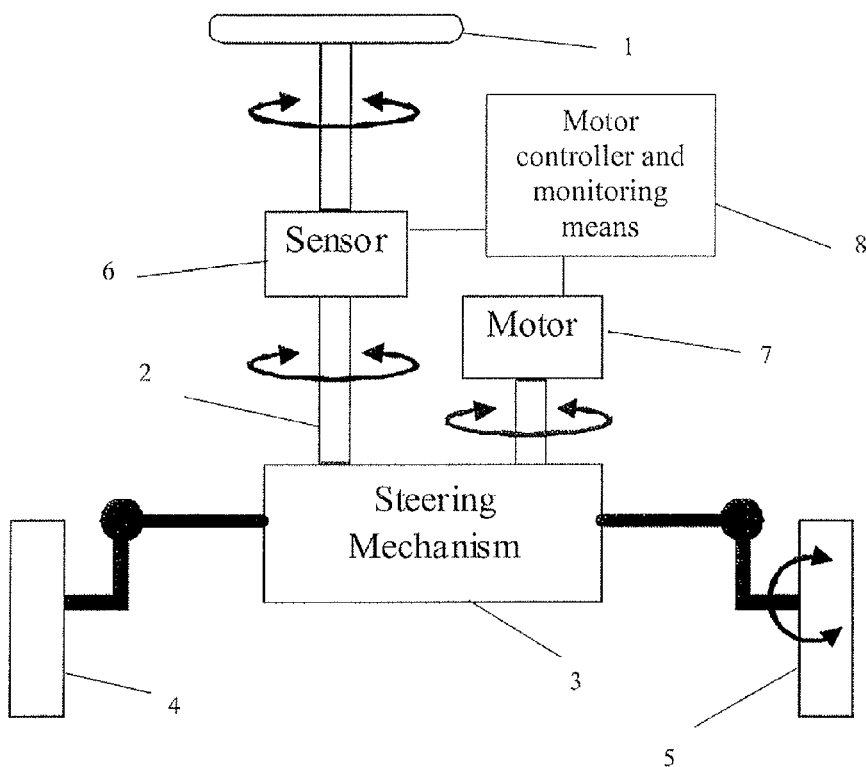
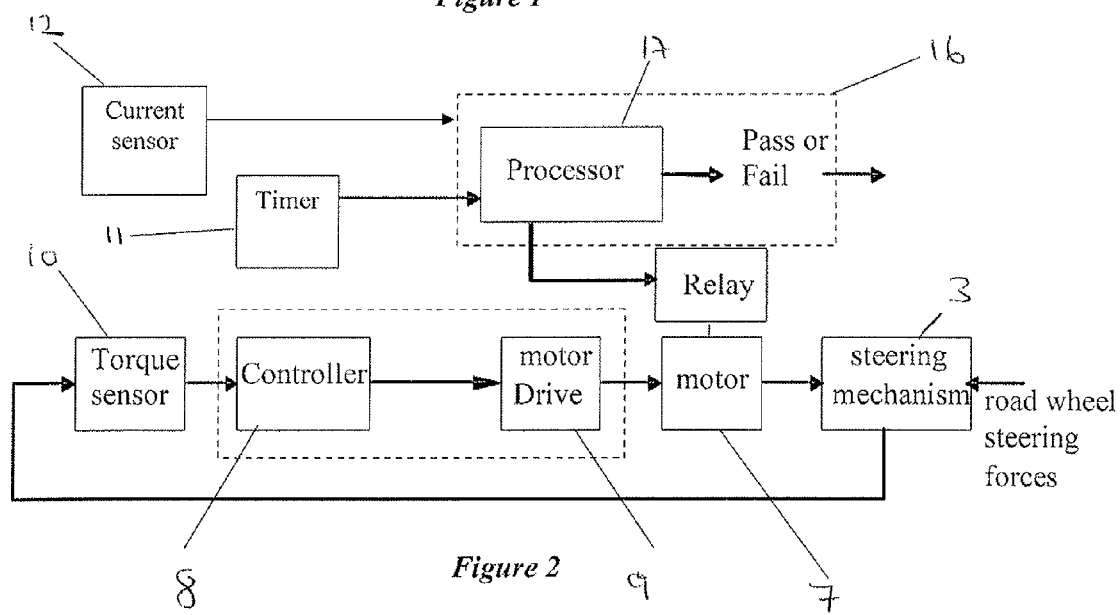
*Figure 1*
*Figure 2*

DIAGNOSTIC METHOD AND APPARATUS FOR ELECTRIC POWER STEERING SYSTEM

CROSS-REFERENCE TO RELATED APPLICATIONS

This application claims the benefit of Great Britain Application No. 1013106.8, filed Aug. 4, 2010, the disclosure of which is incorporated herein by reference.

BACKGROUND OF THE INVENTION

The present invention relates to a diagnostic method for an electric power steering systems, and to a system incorporating such a method especially during start-up.

It is well known to use an electric motor to apply an assistance torque to a part of a steering apparatus of a vehicle which is of the same sense as the torque applied by the driver, thus reducing the amount of torque needed to turn the wheel. The torque demanded by the driver is usually measured using a torque sensor which is connected to the steering column, and the output of the sensor which is indicative of the torque demand is used as an input for a motor controller. The controller produces a torque signal which is fed to a motor drive circuit, typically a set of motor phase switches that, by opening and closing, can selectively connect each phase of the motor to the positive or negative side of a battery. The motor drive circuit, in response to the output of the controller, ensures that that required current is applied to each phase at the right time to produce the desired torque from the motor.

It is also known to provide one or more relays in series between the motor phases and the drive circuit, or at the star or phase neutral point or even between the drive circuit and the battery. In a 3 phase arrangement then preferably 2 relays would be required either between the drive stage and motor phases or at the star or neutral point. When the system is shut down the relay contacts are open so that no current can flow through the motor phases. On start-up the relay contacts are closed to allow current to flow through the relay and the motor phases. They remain closed during use of the steering system until it is shut down or a fault is detected which could lead to a closed loop path through two phases the motor. By opening the relay contacts the loop is broken and current is prevented from following through the motor.

The applicant has appreciated that a potential problem may arise where dry relay contacts are used and the relays are left open for extended periods in harsh environments. It is known that under such conditions a film of dirt and corrosion can build up on the contacts which is insulating and may prevent the relay, upon closing, providing a flow path for the motor phase currents.

Relay wetting is known as a solution to the problem of film build up. Typically a high current, equal to the wetting current specified for the relay, is applied to the relay immediately that it is closed and held for a defined period of time. This current burns through the film and conditions the relay contact. The time required varies from relay to relay but typically a current of at least 10 Amps held for at least 0.5 seconds is required for a relay suitable for use in an electric power steering apparatus. A lower current of, say 5 Amps, could be used but would need to be applied for a longer time to wet the contacts. The applicant has appreciated that this traditional solution of relay wetting is not acceptable in a power steering application as it increases the delay between start-up and the system being available for use. This delay may be noticeable to a user of the system. Also, it has been appreciated that reducing the time by increasing the current is not acceptable is it would lead to a high torque being applied to the motor which might be felt through the steering wheel. Again this would not be acceptable.

SUMMARY OF THE INVENTION

According to a first aspect the invention provides a method of diagnosing a correct operation of a phase or star point isolation relay in an electric power steering system of the kind comprising a motor drive circuit and at least one phase isolation relay which connects a part of the drive circuit to a phase of the motor, the relay being opened during shutdown to isolate the motor phase from the part of the drive circuit and normally closed during operation of the motor to connect the phase to the part of the drive circuit, the method comprising the steps of:

(a) closing the relay;

(b) demanding a current through the motor phase associated with the relay that is equal to a predetermined value;

(c) measuring at least one characteristic of the phase current in that phase after a predetermined period of time has elapsed, said predetermined period of time, for example, being less than the time required for the current to rise to the demanded current value;

(d) comparing the measured characteristic of the phase current with a reference characteristic of the phase current; and (e) in the event that the measured characteristic does not correspond with the reference characteristic opening the relay and subsequently repeating steps (a) to (d).

The invention therefore provides a diagnostic method in which it is possible to glean information about the correct closing of the relay according to whether the current that is flowing behaves in an expected characteristic way compared with a reference characteristic.

The measured characteristic may comprise the rate of increase in current over the predetermined time, at an instant in time, which when compared with a reference will show if the current is increasing at the expected rate.

Alternatively, the characteristic may comprise the value of the current at the end of the predetermined time, which may be compared with a reference value of current to determine if the threshold is met or exceeded. This reference value may, for instance, be less than or equivalent to 50 percent of the demanded current value, or perhaps less than 40 percent of the value. Where the demanded current is, say, about 4 amps, it may be about 1.5 amps.

The method may, in step (e) cause the steps (a) to (d) to be repeated a preset number of times, perhaps 3 times or 5 times. The current applied in each of the three steps may be different or the same.

Furthermore, in step (e) a Woodpecker strategy may be used, by which we may mean the opening and closing of the relay contacts a plurality of time in rapid succession as a method of cleaning the relay contact surfaces prior to repeating the diagnostic procedure.

In the event that the preset number of attempts has been made and the measured characteristic still does not correspond to the reference characteristic, for instance if a threshold current level is still not met or exceeded the method may comprise a step of generating a code indicating a fault, or perhaps shutting down the system.

Where two or more relays are provided, one in each of two phases, the method may demand a current in one phase equal and opposite to the current demanded in one of the other phases, and in any case may demand an overall current from the relays that sums to zero. For instance, +4 Amps may be demanded in one phase and −4 Amps in the other. Where three relays are provided the method may deman +2 Amps in one and +2 Amps in the other and −4 Amps in the other (or −2 Amps, −2 Amps and +4 Amps). The method may comprise closing both relays at the same, or substantially the same, time.

The steps (a) and (b) may be performed in any order but preferably step (a) is performed and then step (b), with the time period recited in step (c) being taken from the time that the current first starts to flow in the phase or the relay is closed. On each repeat of steps (a) to (d) a new time period will be started commencing from the start of flow of current or closing of the relay. On the other hand step (b) could be performed first and then step (a) after it followed by steps (c) and (d).

The invention may further comprise in a subsequent step applying a wetting current sufficient to cause an arc that burns off any film, perhaps during close down.

According to a second aspect the invention provides an electric power assisted steering system of the kind including an electric motor, a motor drive circuit and at least one phase or star point isolation relay which connects a part of the drive circuit to a phase of the motor, the relay being opened during shutdown to isolate the motor phase from the part of the drive circuit and normally closed during operation of the motor to connect the motor phase to part of the drive circuit, to the system further including a diagnostic circuit which includes a processor that is arranged to cause the system to perform a diagnostic sub-routine and is arranged to receive, during the sub-routine, a count signal which is indicative of the elapsed time following closing of the relay and a value indicative of at least one characteristic of the phase current after the count signal indicates that a predetermined period of time has elapsed, said elapsed time being less than a time needed for the phase current to reach the demanded current, and further in which the processor is arranged to compare the received characteristic of the phase current with a reference characteristic; and in the event that the received characteristic does not correspond with the reference characteristic cause the relay to open and subsequently repeat the diagnostic sub routine.

The diagnostic circuit may cause the sub-routine to be repeated a predetermined number of times, say 3 times, and at the end of the repeats if the comparison indicates that the measured characteristic does not correspond to the reference characteristic the diagnostic circuit may issue a warning of a fault.

Various aspects of this invention will become apparent to those skilled in the art from the following detailed description of the preferred embodiment, when read in light of the accompanying drawings.

BRIEF DESCRIPTION OF THE DRAWINGS

There will now be described, by way of example only, one embodiment of the present invention with reference to the accompanying drawings of which:

FIG. 1 is a general view of an electric power steering system for a vehicle;

FIG. 2 is a block diagram illustrating the key components of the assistance system of the power steering system of FIG. 1 which includes a diagnostic circuit in accordance with the present invention;

DETAILED DESCRIPTION OF THE PREFERRED EMBODIMENT

Figure 3:
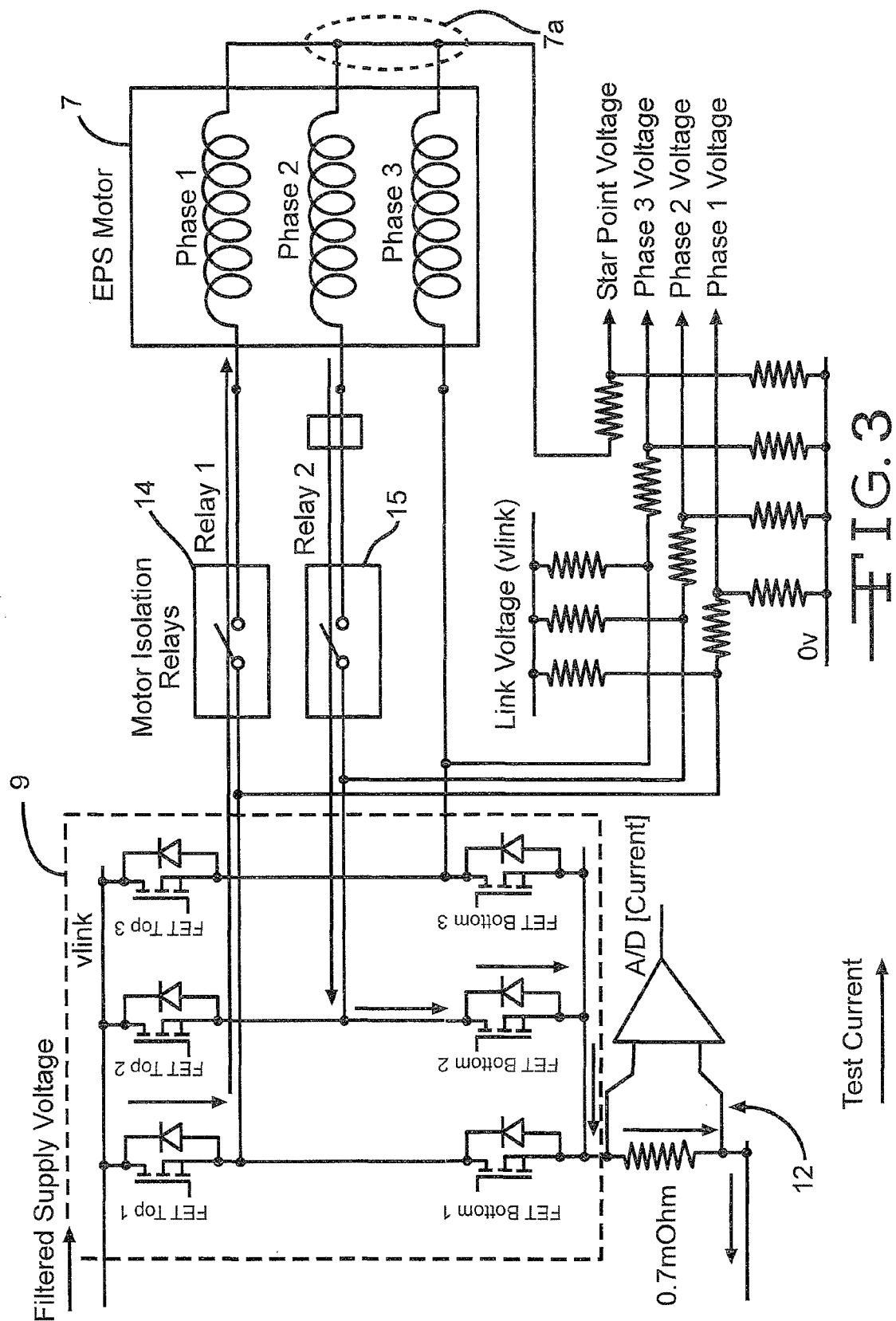
FIG. 3 is a circuit diagram showing the various component parts of the drive circuit, the motor, the current measurement circuit and the location of two motor isolation relays of the system of FIG. 2.

As shown in FIG. 1 an electric power assisted steering system comprises a hand wheel 1 connected to an upper end of a steering shaft 2. The lower end of the steering shaft carries a pinion gear (not shown) which is connected to a steering rack forming part of a steering mechanism 3. The steering mechanism is connected to left and right road wheels 4,5 of the vehicle through steering arms. As the driver turns the hand wheel 1 the steering shaft 2 rotates. The rack and pinion of the steering mechanism converts this rotation into linear displacement of the steering rack which produces a linear translation of the arms that causes the road wheels 4,5 to turn about their steering axis. Such an arrangement is very well known in the art, and many variations are possible. For instance, the steering gear could comprise a recirculating ball type arrangement rather than a rack and pinion.

The steering shaft 2 includes a section of reduced torsional rigidity known as a torsion bar or quill shaft, which separates the upper end of the shaft from the lower end. The provision of this section ensures a relatively large angular displacement of the upper and lower ends of the quill shaft when subject to torque applied to the handwheel by the driver. A torque sensor 6 is associated with the quill shaft and produces an output signal indicative of the torque carried by the steering shaft by measuring the relative angular positions of the upper and lower ends of the quill shaft. Of course, other types of torque sensor may be provided within the scope of the invention. Because the torque sensor measures the torque carried by the steering shaft 2, the output of the torque sensor 6 can be used as an indication of the torque demanded by the driver. An increased torque measurement indicates that the driver is applying a large turning force to the handwheel 1.

An electric motor 7 is provided which is connected to the steering mechanism (or alternatively to the shaft 2) through a further pinion. In this example, the motor 7 comprises a three phase electrically commutated sinusoidal AC brushless permanent magnet synchronous motor which comprises a rotor having, for example, six magnets mounted on it, which in this instance are arranged to provide six poles which alternate between north and south around the motor. A stator, in this example, comprises a nine slot copper wound element having three groups of three teeth, each group of teeth having a common winding forming a respective phase. The motor therefore passes through three complete electrical cycles on each full rotation of the rotor. The diagnostic method will however equally apply to motors of different configurations including motors of a DC type.

The three motor windings marked Phase 1,2 and 3 of the motor 7 are connected in a star network as shown in FIG. 3. A delta network could be used. One end of each phase winding is connected to a respective terminal and the other ends of the three windings are connected together to form a star centre point 7a.

A drive circuit is provided which comprises a three phase bridge. Each phase of the bridge comprises a top arm including a top switching FET transistor, and a bottom arm including a bottom switching FET transistor. The top and bottom arms are connected at the one end of the respective phase winding, the other ends of each top arm being connected together to a supply rail Vlink, typically of 12 volts. The other ends of the bottom arms are connected together to a ground line that is connected to ground. Between the ground line and the drive circuit is a current sense resistor 12, and a comparator measures the voltage drop across this resistor so as to determine the current flowing through the resistor and hence the drive circuit and motor phases. By suitable modulation of the motor currents it is possible to measure, from this current sense resistor, the current in each phase of the motor. Alternatively, each phase may be provided with a current sensor although this would increase costs.

The switches are turned on and off in a controlled pattern by a motor drive circuit 9 to provide pulse width modulation (PWM) of the potential difference applied to each of the windings and hence the current flowing through the motor. This in turn controls the strength and orientation of the magnetic field and hence the torque and speed of the motor.

The motor drive circuit 9 is controlled by a PWM motor controller 8 as shown in FIG. 2 of the accompanying drawings. The controller 8 takes as an input an estimate of the position of the motor, and a measure of the torque demanded by the driver as measured using a torque sensor 10. In basic terms the controller 8 decides what torque is required from the motor 7, and the motor drive circuit 9 applies current to the phases of the motor 7 so as to achieve the required torque output from the motor. The system also includes a clock or counter 11 which can be used to measure elapsed time between a start and end event time.

As shown in FIG. 3 two phases of the motor are protected by a phase isolation relay 14,15 which connects a part of the drive circuit to a phase of the motor. The relay is normally opened during shutdown to isolate the motor phase from the part of the drive circuit and normally closed during operation of the motor to isolate the phase from the part of the drive circuit. A relay is not provided in the third phase as two relays are enough to ensure that there is not closed loop around the motor through which current could flow when the relays are opened. This arrangement can be equally implemented in substantially similar form where said isolation relays 14 and 15 are located at the star or neutral point of the motor.

The apparatus further includes a diagnostic circuit 16 which is used to diagnose correct operation of the relays. The diagnostic circuit is shown in FIG. 2 and includes a processor 17 that is arranged to cause the system to perform a diagnostic sub-routine and output a pass or fail. The circuit receives as an input a count signal from the timer 11 which is indicative of the elapsed time following closing of the relays 14,15. It also receives a current measurement from the current sensor 12, and a measurement of the relay coil voltage, which indicates whether the relay is closed or open.

Figure 4:
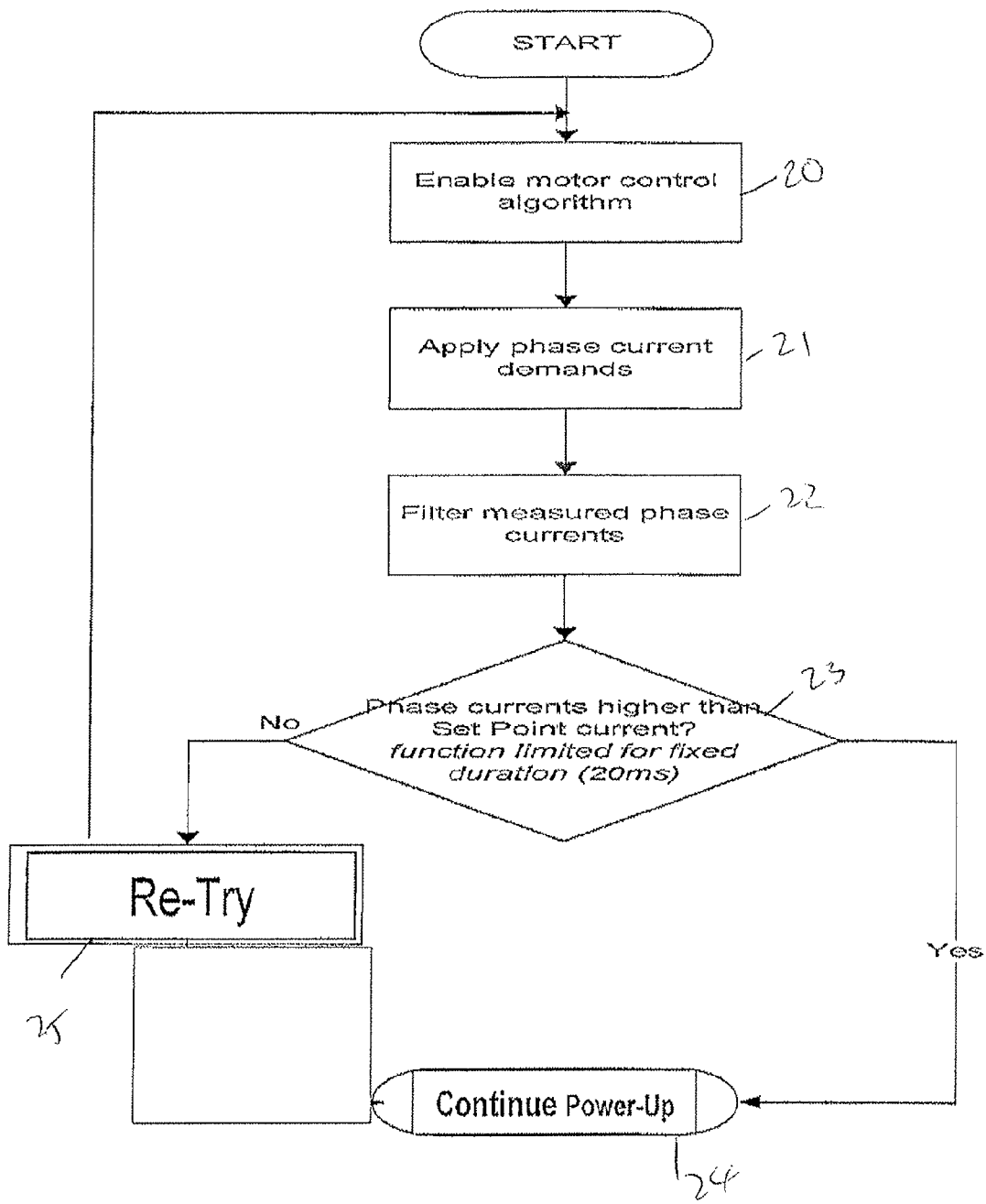
FIG. 4 is a flow diagram showing the sequence of steps performed by the diagnostic circuit when performing a diagnostic test which falls within the scope of the first aspect of the present invention.

The diagnostic circuit 16 is arranged to carry out the following diagnostic method which is illustrated in the flow chart of FIG. 4 of the drawings.

In a first step 20, upon start up/power up when the two relays are moved from the open to the closed position and the motor controller becomes functional. The motor controller next demands 21 current through the motor phases that is equal to a predetermined value. In this case a current of +4 Amps is demanded to flow through the phase associated with one of the relays and −4 Amps through the phase associated with the other. The flow path of these currents is shown in FIG. 3 of the accompanying drawings. This demand is fed to the motor drive circuit which sets the FETs to the correct positions to start to achieve the demanded current in the motor phases.

Figure 5:
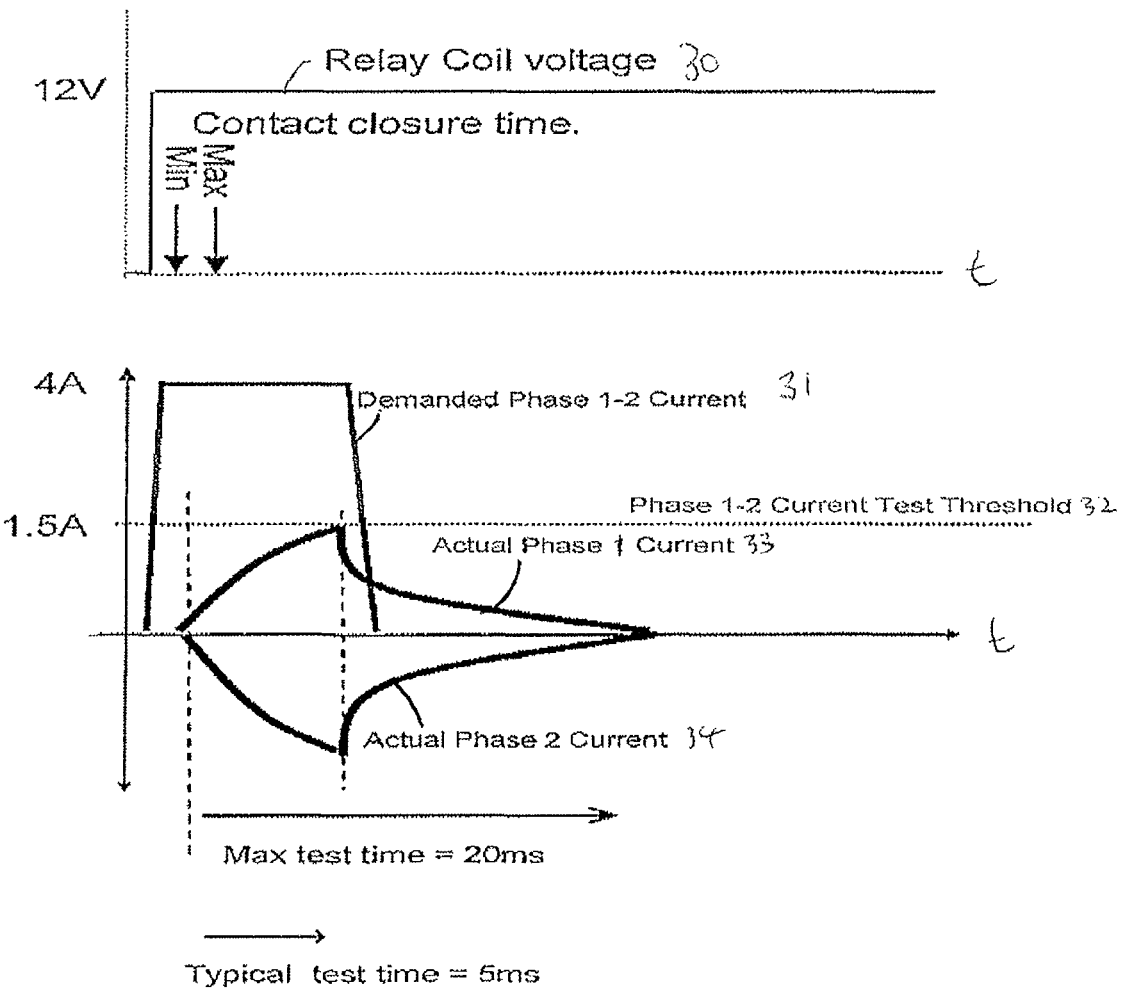
FIG. 5 is a graph showing relay coil voltage, measured phase current and reference phase current against time over run of the diagnostic subroutine resulting in a pass.

Optionally, after a preset time has elapsed, in this example 20 milliseconds, the processor of the diagnostic circuit filters and stores 22 the value of the current in each of the two phases as measured by the current sensor. The processor then compares 23 each stored value with a prestored reference value held in a memory accessible to the processor. In this example, the stored values are +1.5 Amps and −1.5 Amps. In the event that the measured current does correspond with the stored values (by which we may mean it meets or exceeds the stored values in magnitude or is within a percentage acceptable margin of error of the stored value) the processor will determine that the diagnostic test has been passed and end the test 24 leaving the relays closed and continuing the power up of the system. FIG. 5 shows relay coil voltage (trace 30) against time as well as measured current for both phases 33,34 and reference current 32 plotted against time t. As can be seen, at an elapsed time of 20 milliseconds from the contact "closing" the measured current 33 has not reached the 4 Amp demanded current but has reached the 1.5 Amp reference threshold current which means it has passed. Marked on the figure are max and min contact closure times, which define a range of times within which the relay will close after it is energised.

Figure 6:
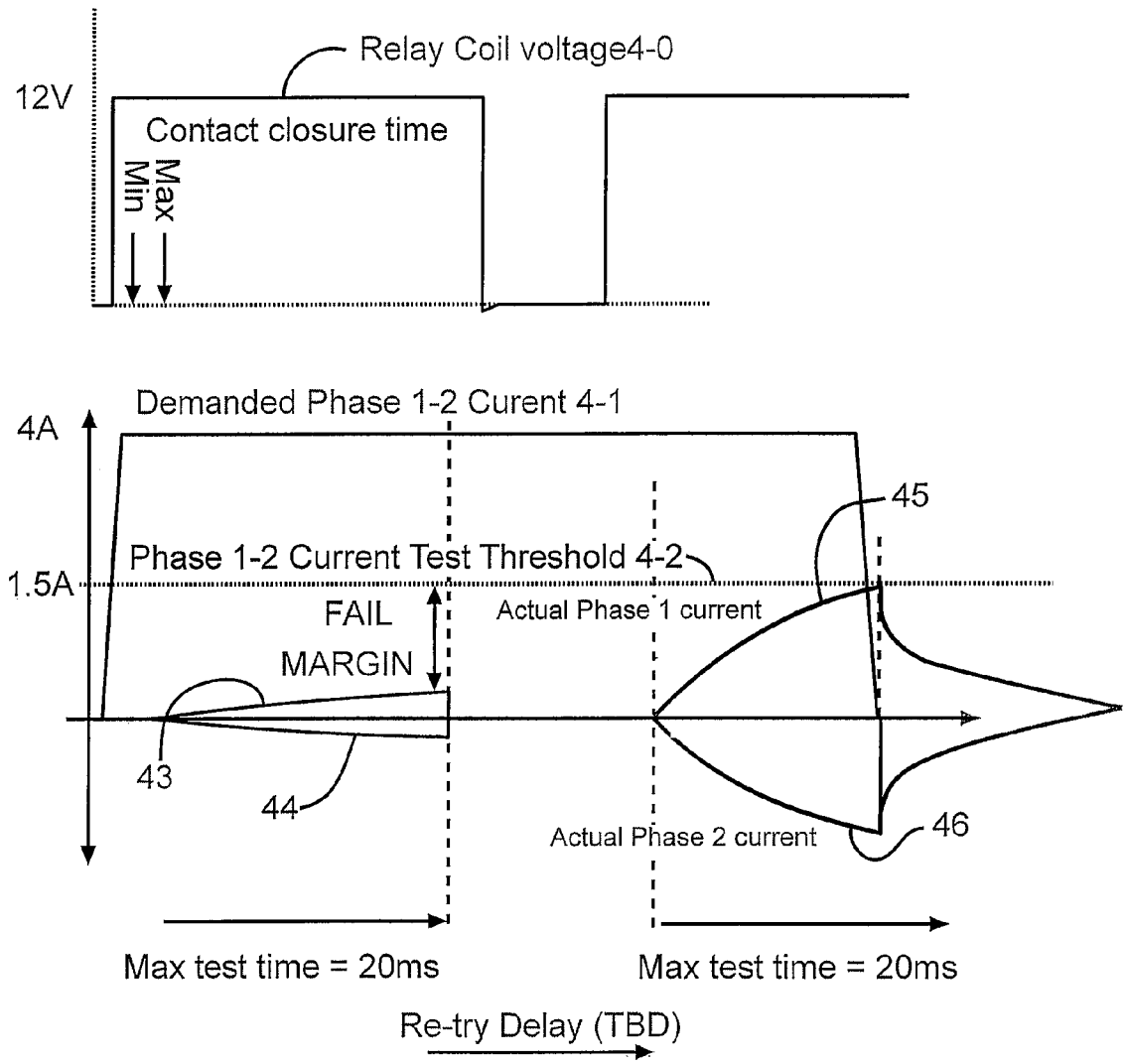
FIG. 6 is a graph corresponding to FIG. 5 for two runs of the sub-routine in which the first run lead to a fail and the second a pass.

In the event that the measured currents are too small in magnitude compared with the reference values, the processor will conclude that the test has not been passed. It will then cause the relays to be opened and the test repeated 25 (close relays, wait, measure, compare). This is repeated 3 times until the test is either passed or failed. At the end of 3 repeats if it is still failed then a warning is raised indicating a fault. FIG. 6 is a graph showing a diagnostic run with the same relay and relay coil voltage 40 in which a fail is obtained in the first run of the sub-routine because the measured currents 43,44 do not meet the threshold reference current 42 of 1.5 Amps and a pass in the second because the currents measured 45,46 do meet the threshold. This indicates that the first time the relay did not close properly but on the second time it did.

The principle and mode of operation of this invention have been explained and illustrated in its preferred embodiment. However, it must be understood that this invention may be practiced otherwise than as specifically explained and illustrated without departing from its spirit or scope.

What is claimed is:

1. A method of diagnosing a correct operation of an isolation relay in an electric power steering system including a motor drive circuit and at least one phase isolation relay which connects a part of said motor drive circuit to a phase of said motor, said phase isolation relay being opened during shutdown to isolate said motor phase from said part of said drive circuit and being normally closed during operation of said motor to connect said phase to the part of said drive circuit, said method comprising the steps of:
    (a) closing said phase isolation relay;
    (b) demanding a phase current having a predetermined value through the motor phase associated with said phase isolation relay;
    (c) measuring at least one characteristic of an actual said phase current in said motor phase after a predetermined period of time has elapsed, said predetermined period of time being that is less than an amount of time needed for said measured characteristic of said actual phase current to reach said demanded predetermined current value of said demanded phase current;

(d) comparing, using a processor, said measured characteristic of said actual phase current with a reference characteristic of said demanded phase current that is less than said predetermined value of said demanded phase current; and (e) in the event that said measured characteristic of said actual phase current does not correspond with said reference characteristic of said demanded phase current, opening said phase isolation relay and subsequently repeating steps (a) to (d).

2. A method according to claim 1 wherein said measured characteristic of said actual phase current comprises a rate of increase in current over said predetermined time which, when compared with a reference rate, will show if said actual phase current is increasing at an expected rate.

3. A method according to claim 1 wherein said measured characteristic of said actual phase current comprises the value of said actual phase current at the end of said predetermined time, which is compared with a reference value of current to determine if said reference value is met or exceeded, said reference value being less than about 50 percent of said predetermined value of said demanded phase current value.

4. A method according to claim 1 wherein step (e)causing steps (a) to (d) is repeated a preset number of times.

5. A method according to claim 1 further comprising in step (e) applying a Woodpecker strategy of opening and closing of said phase isolation relay contacts a plurality of times in rapid succession to clean contact surfaces of said relay prior to repeating said steps (a) to (d) diagnostic method.

6. A method according to claim 4 which further comprises, in the event that said preset number of attempts has been made and said measured characteristic of said actual phase current still does not correspond to said reference characteristic of said demanded phase current, generating a code indicating a fault.

7. A method according to claim 1 wherein two or more phase isolation relays are provided, one in each of two phases, and wherein said method further comprises demanding a current in a first one of said two or more phases that is phase equal and opposite to a current demanded in a second different one of said two or more phases.

8. A method according to claim 1 which further comprises in a subsequent step to step (e) applying a wetting current sufficient to cause an arc that burns off any film on said phase isolation relay.

9. An electric power assisted steering system comprising:
an electric motor;
a motor drive circuit;
at least one phase isolation relay which connects a part of said motor drive circuit to a phase of said motor, said phase isolation relay being opened during shutdown to isolate said motor phase from said part of said drive circuit and normally closed during operation of the motor to connect said phase from said part of the drive circuit; and
a processor that is arranged to cause said system to perform a diagnostic sub-routine by:

(1) receiving and is arranged to receive, during the sub-routine, a count signal which is indicative of an elapsed time following closing of said phase isolation relay and a value indicative of at least one measured characteristic of an actual said phase current after said count signal indicates that a predetermined period of time has elapsed, wherein said predetermined period of time is less than an amount of time needed for said measured characteristic of said actual phase current to reach a predetermined value of a demanded phase current;

(2) comparing further in which said processor is arranged to compare said measured characteristic of said actual phase current with a reference characteristic of said demanded phase current that is less than said predetermined value of said demanded phase current; and (3) in the event that said measured characteristic of said actual phase current isolation does not correspond with said reference characteristic of said demanded phase isolation current, causing to cause said relay to open and subsequently repeating to repeat said diagnostic sub routine.

10. An electric power assisted steering system according to claim 9 wherein said processor repeats said diagnostic circuit is adapted to cause said sub-routine to be repeated a predetermined number of times and, at an end of said repeated number of times if the comparison indicates that said measured characteristic of said actual phase current isolation does not correspond with said reference characteristic of said demanded phase isolation current, issues said diagnostic circuit is adapted to issue a warning of a fault.

* * * * *